US007928614B2

(12) United States Patent
Hirnschal et al.

(10) Patent No.: US 7,928,614 B2
(45) Date of Patent: Apr. 19, 2011

(54) HIGH-PERFORMANCE ULTRASONIC TRANSDUCER AND METHOD FOR THE PRODUCTION THEREOF

(75) Inventors: Udo Hirnschal, Halver (DE); Erik Braam, Westborough, MA (US)

(73) Assignee: Markisches Werk GmbH, Halver (DE)

( * ) Notice: Subject to any disclaimer, the term of this patent is extended or adjusted under 35 U.S.C. 154(b) by 0 days.

(21) Appl. No.: 12/859,570

(22) Filed: Aug. 19, 2010

(65) Prior Publication Data

US 2011/0018368 A1 Jan. 27, 2011

Related U.S. Application Data

(63) Continuation of application No. PCT/EP2009/001186, filed on Feb. 19, 2009.

(30) Foreign Application Priority Data

Feb. 22, 2008 (DE) ......................... 10 2008 010 617

(51) Int. Cl.
*H01L 41/00* (2006.01)

(52) U.S. Cl. ..................................... 310/26; 310/323.18

(58) Field of Classification Search .................... 310/26, 310/323.01, 323.18, 325–328
See application file for complete search history.

(56) References Cited

U.S. PATENT DOCUMENTS

| | | | | |
|---|---|---|---|---|
| 6,164,968 | A * | 12/2000 | Feine | 433/119 |
| 6,277,332 | B1 * | 8/2001 | Sucholeiki | 422/128 |
| 6,545,060 | B1 * | 4/2003 | Ruhman et al. | 521/41 |
| 6,578,659 | B2 * | 6/2003 | Manna et al. | 181/142 |
| 7,276,824 | B2 * | 10/2007 | Statnikov et al. | 310/26 |
| 7,339,291 | B2 * | 3/2008 | Mori | 310/26 |
| 7,462,960 | B2 * | 12/2008 | Or et al. | 310/26 |
| 7,504,075 | B2 * | 3/2009 | Marhasin | 422/128 |
| 2007/0040476 | A1 | 2/2007 | Statnikov et al. | |
| 2008/0035627 | A1 * | 2/2008 | Statnikov et al. | 219/158 |

FOREIGN PATENT DOCUMENTS

| | | |
|---|---|---|
| DE | 59963 | 1/1968 |
| EP | 0468125 | 1/1992 |
| WO | 2004/105085 | 12/2004 |
| WO | 2006/055368 | 5/2006 |

OTHER PUBLICATIONS

International Preliminary Report on Patentability and Written Opinion of the International Searching Authority for corresponding international application PCT/EP2009/001186 issued Sep. 7, 2010.

* cited by examiner

*Primary Examiner* — Thanh Lam
(74) *Attorney, Agent, or Firm* — Myers Wolin, LLC

(57) ABSTRACT

The invention relates to an ultrasonic transducer, comprising an ultrasonic flange and a magnetostrictive driver, wherein the driver is connected to a contact surface of the ultrasonic flange that faces the same, and wherein the driver and the ultrasonic flange are connected in the region of the contact surface by means of electron beam welding and/or laser beam welding. The contact surface is configured by the bottom of at least one receiving pocket, which receives the end of the driver on the ultrasonic flange side, and at least one receiving pocket is configured in a pedestal-like elevation of the end of the ultrasonic flange facing the driver, and the pedestal-like elevation is higher than the depth of the receiving jackets configured therein.

10 Claims, 7 Drawing Sheets

HIGH-PERFORMANCE ULTRASONIC TRANSDUCER AND METHOD FOR THE PRODUCTION THEREOF

CROSS REFERENCE TO RELATED APPLICATIONS

This application is a continuation of PCT/EP2009/001186, filed on Feb. 19, 2009, which claims priority to DE Application No. 10 2008 010 617.8, filed on Feb. 22, 2008, the contents of each being incorporated herein by reference.

FIELD OF THE INVENTION

The present invention relates to an ultrasonic transducer comprising an ultrasonic horn and a magnetostrictive driver, wherein the driver is joined to a contact face of the ultrasonic horn proximal thereto, as well as to a method for creating a permanent joint between the ultrasonic horn and the driver of such an ultrasonic transducer.

BACKGROUND OF THE INVENTION

In the prior art of electronic transducers, either piezoelectric or magnetostrictive drivers are used as drivers for the desired ultrasonic vibration. The former have the advantage of high efficiency but the disadvantage of limited output power, due to the low tensile strength of piezoelectric materials. In contrast, higher output power can be generated with magnetostrictive ultrasonic transducers, but in this case the disadvantages of relatively lower efficiency, greater waste heat during operation and a more complex construction or a more expensive production method have to be taken into consideration.

One problem in the design of magnetostrictive ultrasonic transducers is that the magnetostrictive material must be joined appropriately to the ultrasonic horn, such a joint usually being produced in the prior art by means of a soldering method, especially a hard soldering method.

Generic magnetostrictive ultrasonic transducers of the aforesaid type are known, for example, from WO 2004/105085 A1 and WO 2006/055368 A2.

In these ultrasonic transducers, the driver consists of a large number of plates of magnetostrictive material (referred to hereinafter as magnet plates), which are fixed in recesses of the ultrasonic horn or to a surface of the ultrasonic horn by means of a hard soldering method. A suitable geometry of the magnet plates makes it possible to energize the plates with an alternating magnetic field. For this purpose the ultrasonic transducers described in the aforesaid publications are equipped, for example, with a central aperture in the magnet plates and a suitable coil arrangement, with which the two legs of the magnet plates bounding the aperture can be excited to vibrations in the ultrasonic frequency range by passing an appropriate current through the coil and in this way using the magnetostriction effect. These vibrations are then transmitted by the magnet plates to the ultrasonic horn and passed on inside the ultrasonic horn to its vibrating head. However, the disadvantages of magnetostrictive ultrasonic transducers already mentioned above also exist in this prior art.

Furthermore, from DD 59963 A there is known a method for joining electromechanical transducers with coupling elements and implements of ultrasonic generators, wherein the laminated core of a magnetostrictive transducer is joined to a plane end face of the ultrasonic generator by means of electron-beam welding in order to achieve coupling with the lowest possible loss. In this case high energy is needed for the electron beam, in order to weld the laminated core to the end face over the entire area thereof. In addition, this joining technique proves to be not particularly stable, since the laminated core is held exclusively against the plane face.

Finally, EP 0468125 A2 also discloses an ultrasonic horn in which two contiguous portions are joined to one another by means of electron-beam welding or laser-beam welding.

SUMMARY

Against this background, it is the object of the present invention to provide an ultrasonic transducer of the type mentioned in the introduction with improved characteristics. Furthermore, the present invention relates to a method for producing a permanent joint between the ultrasonic horn and magnetostrictive driver of such an ultrasonic transducer.

For this purpose, it is provided according to the invention—in addition to the features already mentioned in the introduction—that the driver and the ultrasonic horn are or will be joined in the zone of the contact face by means of electron-beam welding and/or laser-beam welding, wherein the contact face is formed by the bottom of at least one receiving pocket, which accommodates the end of the driver proximal to the ultrasonic horn, wherein the at least one receiving pocket is formed in a pedestal-like elevation of the end of the ultrasonic horn proximal to the driver, and wherein the height of the pedestal-like elevation is greater than the depth of the receiving pocket formed therein.

In the inventive method, it is provided in addition to the aforesaid features that the electron or laser beam is aligned or guided in such a way that it enters through the side bounding wall of the pedestal-like elevation into the monolithic ultrasonic horn at the height of the contact face and parallel thereto.

In connection with the present invention, it has proved in particular that non-negligible proportions of the problems of magnetostrictive ultrasonic transducers as mentioned in the introduction are caused by the soldered joint provided between driver and ultrasonic horn in the prior art, and so an ultrasonic transducer according to the invention or produced according to the invention is characterized by, among other features, higher efficiency, less waste heat and a large number of further advantages, to be discussed in more detail hereinafter.

As the first advantage of an inventive ultrasonic transducer, it may be pointed out that the method of electron-beam welding or of laser-beam welding employed according to the invention in the zone of the contact face opens up the possibility that the ultrasonic horn, the contact face of the ultrasonic horn and/or the magnetostrictive material of the driver can be subjected to separate heat treatments before the inventive welded joint is created, specifically without subsequently destroying the associated advantages once again or adversely influencing them during subsequent creation of a permanent joint between driver and ultrasonic horn.

In contrast, the method of hard soldering known from the prior art is associated with the disadvantage that the temperatures in the range of approximately 750° C. needed for hard soldering adversely alter, once again, the material microstructure, created beforehand by laborious heat treatment, of the ultrasonic horn and/or of the magnetostrictive material of the driver, and so the advantages of previous heat treatment of the said elements are no longer fully realized in the finished ultrasonic transducer. In the case of electron-beam welding or laser-beam welding, on the other hand, the thermal stress on the ultrasonic transducer is less and is limited to a much smaller zone—even in comparison to other welding methods.

Furthermore, it was found in connection with the present invention that the method of electron-beam welding or laser-beam welding provided according to the invention guarantees better transmission of the acoustic vibrations from the driver to the ultrasonic horn. In this regard, it may be assumed that the solder material (referred to as solder) used for soldering in the prior art causes a large damping effect on the acoustic vibrations in the zone of the joining point. Thus the efficiency of an inventive ultrasonic transducer is high compared with the prior art.

In addition, better mechanical strength of the completed joint is assured by application of the joining technique provided according to the invention. This has a positive effect on the fatigue limit of an inventive ultrasonic transducer and in particular also leads to a greater load capacity of the joining point between driver and ultrasonic horn. Not only is the possibility of use under higher loads opened up thereby but also greater flexibility is achieved in terms of the exact layout of the joining point in view of the acoustic vibration conditions over the length of the ultrasonic transducer.

In turn, a further aspect of the present invention, not adequately considered in the known prior art, is based on the circumstance that a large zone around the actual joining point was exposed to a high temperature during soldering or hard soldering (approximately 750° C. during hard soldering), whereas this is not the case in electron-beam welding or laser-beam welding. In this regard it must be pointed out that the magnetostrictive material of the driver of an inventive ultrasonic transducer is preferably equipped with an insulating layer, which often becomes damaged over a large area by exposure to the temperatures necessary for soldering, in turn potentially leading, for example, to short circuits between adjacent elements of the driver. In contrast, during electron-beam welding or laser-beam welding according to the present invention, the height of the weld—needed to join the driver to the ultrasonic horn and formed transversely along the contact face—is advantageously limited to a value of approximately 1-2 mm, thus greatly reducing the damage to insulating layers on the magnetostrictive material of the driver.

Furthermore, yet another advantageous effect is evident in connection with the present invention. Since a meltable metal alloy was always employed as bonding material in the soldering methods used in the prior art, the magnet plates forming the driver were contacted in large zones around the contact face by the conductive solder or were short-circuited with one another and with the contact face of the ultrasonic horn. This leads to greater electrical losses during electromagnetic excitation of vibrations and ultimately to greater heat generation in the zone of the joining point during operation of an ultrasonic oscillator. This adverse effect can be reduced with the present invention, since only a relatively small joint zone is created in the zone of the outermost edge of the driver during electron-beam or laser-beam welding, especially when this is performed along the contact face between ultrasonic horn and driver, as in the present case. Cooling devices that formerly were difficult to construct for the ultrasonic transducer can therefore be constructed more easily or can even be completely omitted.

The techniques of electron-beam or laser-beam welding applied in connection with the present invention—either alternately or if necessary in succession (for example, also at different locations)—are known as such, and so detailed explanations in this regard are unnecessary. However, it must be pointed out that it is possible in both cases to create welds having a predetermined depth, which is adequate in connection with the present invention. This is obvious, especially in view of the particularly advantageous circumstance that the contact face where the inventive welded joint is to be created is sometimes not directly accessible.

Furthermore, it is provided in connection with the present invention that the contact face along which the welded joint between the edge of the driver and the contact face of the ultrasonic horn will be created is formed by the bottom of at least one receiving pocket, which accommodates the end of the driver proximal to the ultrasonic horn. In this connection, the term receiving pocket is to be advantageously understood as a recess, adapted to the contour of the driver or magnetostrictive elements, in the side of the ultrasonic horn proximal to the driver.

During electron-beam or laser-beam welding, seam depths sufficiently large for the present purpose can be produced for the weld to be created, and so the electron or laser beam used for creation of the welded joint can be guided and adjusted in such a way that it creates the required welded joint through an edge zone of the monolithic ultrasonic horn in the zone of the bottom of a receiving pocket serving as the contact face—and in fact does so without causing a short circuit of adjacent magnetostrictive elements in zones above the actual weld or an unwanted change of the material microstructure in large zones around the actual joining point or area.

Advantageously, the electron or laser beam is directed sideways onto the ultrasonic horn, parallel to and at the height of the contact face formed by the bottom of the receiving pocket, whereby the driver bearing against the ultrasonic horn at the corresponding height in the at least one receiving pocket is welded to the bottom of the receiving pocket in the zone of its contact face.

Furthermore, in the inventive ultrasonic transducer, it is provided that the at least one receiving pocket is formed in a pedestal-like elevation of the end of the ultrasonic horn proximal to the driver. Although the term pedestal-like elevation is used here, it may also be constructed by machining down a zone of the ultrasonic horn surrounding the receiving pocket.

This decisively facilitates the welding operation provided according to the invention, especially when it is additionally provided, as is the case in connection with the present invention, that the height of the pedestal-like elevation is greater than the depth of the receiving pocket formed therein.

Hereby the electron or laser beam oriented preferably parallel to the contact face during welding can be guided in such a way that, from the outside, it enters a side bounding wall of the pedestal—which has a reduced cross section—at approximately the height of the contact face, whereby the necessary penetration depth for the electron or laser beam can be further reduced, as can the energy input associated therewith, including the adverse effects on the material microstructure adjacent to the weld. Specifically, the beam has to travel only a shorter path through the monolithic ultrasonic horn in order to reach the actual joint zone between driver or magnet plates and ultrasonic horn.

Conceivable materials for the (at least) one ultrasonic horn and the magnetostrictive driver are the materials known for this purpose from the prior art, and, in the case of the ultrasonic horn—which may be subjected to various loads depending on its intended use—include in particular aluminum, titanium, various steels and especially also nickel-based alloys (such as Nimonic 80A; see DIN 2.4952). As material for the driver, it is possible in principle to use all kinds of magnetostrictive materials, although obviously those with high magnetostriction capacity are to be preferred. Examples in this category are FeCo alloys or terbium-containing alloys, such as the alloy families known under the generic names of Hiperco, Terfenol and Gerfenol.

It must be pointed out expressly at this place that the magnetostrictive driver—which can be excited to vibrations with a suitable coil arrangement—of an inventive ultrasonic transducer can be constructed in the most diverse geometries from one or more magnetostrictive elements, as long as it is then suitable for transducing ultrasonic energy and in connection with the invention can be welded at least at the edge or end face to a contact face of the ultrasonic horn proximal thereto.

In particular, it is possible in a preferred configuration of the invention to provide that the driver is composed of only one single magnetostrictive element (for example, in the form of a plate or bar).

In a further preferred configuration of the invention, however, it is possible to provide that the driver as the magnetostrictive element comprises a plurality of magnet plates as magnetostrictive elements, while simultaneously avoiding the disadvantages that result in this connection in the prior art.

In a preferred configuration of the inventive method, it is possible to provide additionally, in the case of a driver composed of a plurality of magnet plates, that the electron or laser beam guided over the entire joint zone is aligned not only parallel to the contact face but also is always parallel to the lines of contact between the magnet plates and the contact face on the ultrasonic horn. The said line of contact is defined by the linear extent of the edge of the respective magnet plate bearing on the contact face. This alignment of the beam leads to further minimization of the short circuits occurring between adjacent magnet plates in the weld zone.

In order also to further reduce the temperature load or energy input, which in any case is low in comparison with the prior art, in the weld zone, it may be further provided that the electron and/or laser beam is guided over the joint zone in such a way that a first part of the welded joint is created from a first side and a second part of the welded joint is created from a second side, preferably the opposite side. Thereby the penetration depth of the electron or laser beam necessary for creation of a sufficiently stable welded joint can be substantially halved, and so the edge of the driver or the edge of the magnetostrictive elements bearing on the contact face—in the imaginary lines through the actual joint zone—can advantageously be welded to the contact face of the ultrasonic horn firstly from one side to approximately the middle (or slightly beyond), after which the other part or the other half is welded from the opposite side.

In connection with the invention, there are preferably provided several receiving pockets, in each of which part of the driver or of the magnet plates (in the form of laminated cores if necessary) is accommodated. Hereby the bonding of the driver to the ultrasonic horn is further improved in terms of stability of the joint.

Finally, an already mentioned aspect of the present invention materializes if, in a further preferred improvement of the invention, the ultrasonic horn and/or the magnetostrictive material of the driver is subjected at least in part (for example, only in zones relevant for this purpose) to a (separate) heat treatment.

The high-power ultrasonic transducers provided according to the invention are suitable in principle for any desired intended uses of ultrasonic transducers, although in view of the inventive advantages it is possible in particular to conceive of applications with high loads (such as use of the ultrasonic transducer for treatment of liquid fossil fuels or other liquids). Consequently, preliminary heat treatment of the ultrasonic horn, if appropriate only in the zone of the contact face(s) subjected to the particular loads and/or of the vibration head, which is distal relative to the driver and also highly loaded, may prove advantageous. Even in the case of the driver it may be advantageous to apply preliminary heat treatment, since hereby it may be possible in particular to optimize the magnetostrictive characteristics of the material being used. Besides, the heat treatment leads to an insulating oxide layer on the surface of the magnet plates, whereby the magnet plates, which preferably bear upon one another in stacks, are insulated from one another. As already explained, the joining techniques known from the prior art suffered from the problem, noticed in connection with the present invention, that the material microstructure or the magnetostrictive characteristics of the heat-treated material or the oxide layer or a separately applied insulating layer on the surface of the magnetostrictive elements of a driver were destroyed or adversely influenced by a high heat load being input into large zones (for example, during hard soldering). In contrast, this adverse effect (reduction of the strength of the horn or strength and magnetostrictive characteristics of the driver; short circuits between the magnet plates due to destruction of the insulating layer) does not occur at all or at worst occurs in a locally limited zone during the electron or laser beam welding method used according to the invention, and so the already mentioned advantages of the invention are also manifested in this respect.

Furthermore, it must be pointed out that an ultrasonic horn of an inventive ultrasonic transducer does not necessarily have to be constructed in one piece, but instead it may be constructed in multiple pieces, especially two pieces. Thus, in yet another preferred configuration of the invention, it may be provided that the contact face is formed on an intermediate part of the ultrasonic horn, which part is joined (for example by screwed connection) to the other part of the ultrasonic horn.

And finally it must be pointed out that the present invention also comprises an ultrasonic transducer that comprises one magnetostrictive driver and in total two ultrasonic horns disposed on different sides of the driver. In this case, an inventive welded joint between the driver and the respective ultrasonic horn must then be provided on both sides of the driver in the zone of the respective contact face of the ultrasonic horn.

BRIEF DESCRIPTION OF THE DRAWINGS

The invention will be explained in more detail hereinafter on the basis of several exemplary embodiments illustrated in the drawing, wherein.

DETAILED DESCRIPTION

Figure 1:
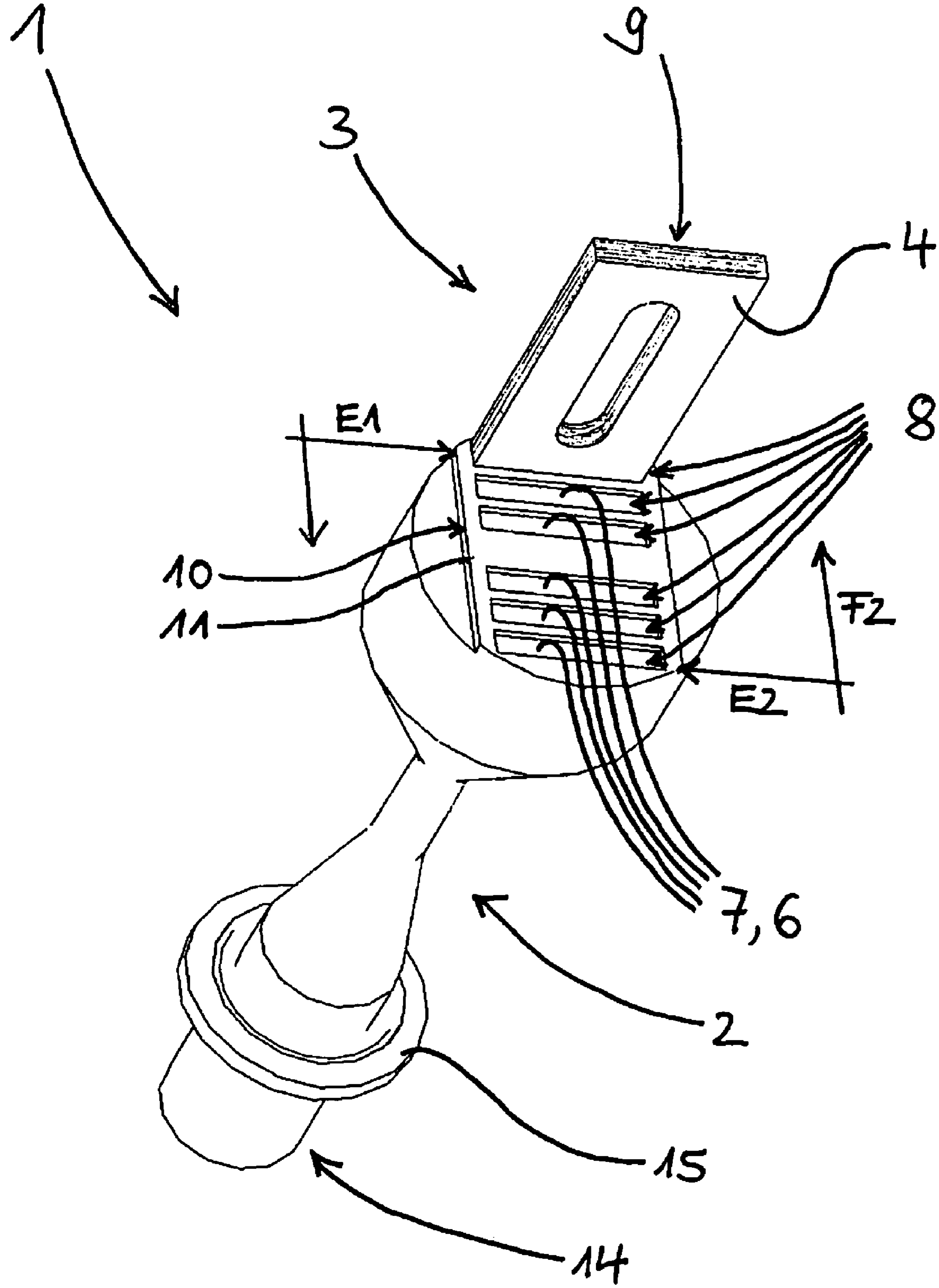
FIG. 1 shows a perspective view of a first exemplary embodiment of an inventive ultrasonic transducer.
Figure 2:
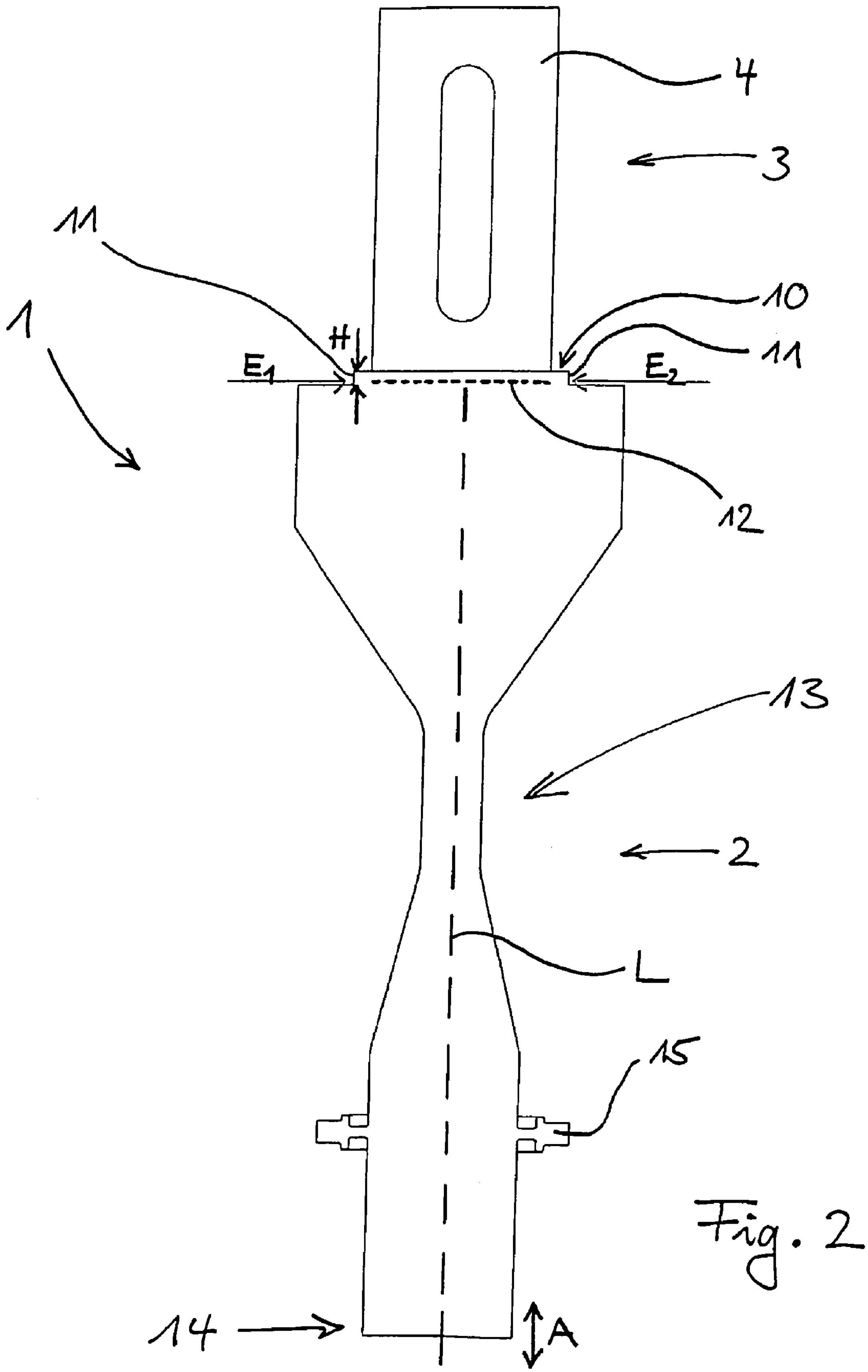
FIG. 2 shows a first longitudinal section through the ultrasonic transducer of FIG. 1 parallel to the plane spanned by the magnet plates.
Figure 3:
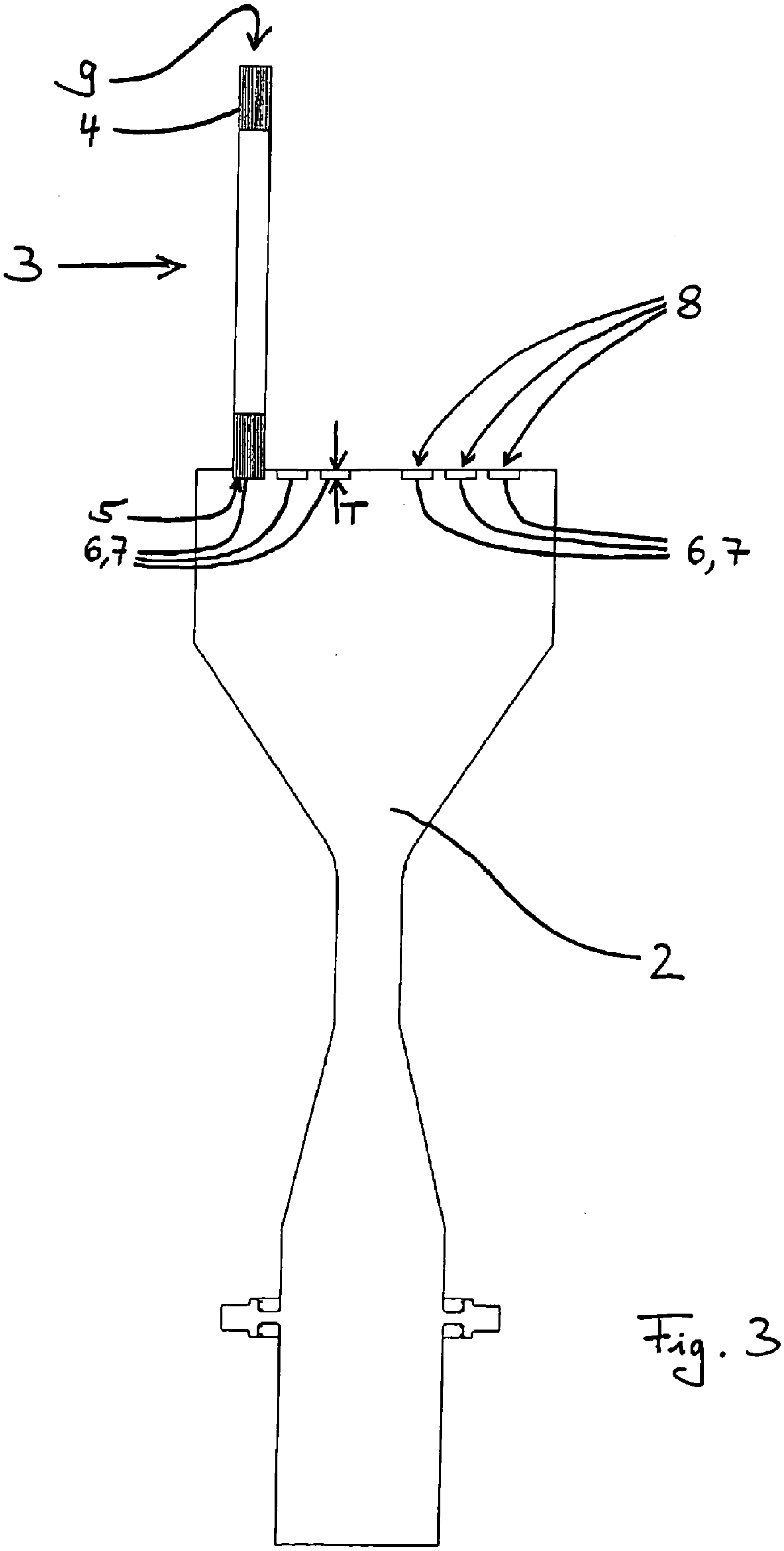
FIG. 3 shows a second longitudinal section through the ultrasonic transducer of FIG. 1 perpendicular to the plane spanned by the magnet plates.

The first exemplary embodiment of an inventive ultrasonic transducer 1, illustrated in FIGS. 1 to 3, comprises a heat-treated ultrasonic horn 2 and a driver 3, which for reasons of clarity is illustrated only partly, can be energized by means of a plurality of coils not illustrated, functions on the principle of magnetostriction and is composed of a large number of magnet plates 4, which are grouped into six stacks 9 in total (only one being illustrated here). Magnet plates 4, which are made of a magnetostrictive material and have also been heat treated, bear with their edge 5 proximal to ultrasonic horn 2 on a contact face 6, in the illustrated exemplary embodiment each contact face 6 being formed respectively by the bottom 7 of a receiving pocket 8, which is rectangular in overhead view. In total, there are provided six receiving pockets 8, in each of which, in the finish-assembled ultrasonic transducer 1, there is accommodated the end of a stack 9 of a plurality of magnet plates 4, each stack in the present exemplary embodiment being composed of twenty-two magnet plates, each 0.4 mm thick. It is self-evident that a smaller or larger number of magnet plates or different plate thicknesses may also be used.

Receiving pockets 8 are formed in a pedestal-like elevation 10, whose height H (see FIG. 2) is greater than the depth T (see FIG. 3) of receiving pockets 8. To create the inventive joint between driver 3 formed from magnet plates 4 and ultrasonic horn 2, an electron beam can be aligned or guided in such a way according to arrows E1 and E2 that it enters the monolithic ultrasonic horn sideways, or in other words through side bounding wall 11 of pedestal-like elevation 10, at the height of contact face 6 (see dashed line 12 in FIG. 2) and parallel thereto. Instead of an electron beam, however, a laser beam that can be appropriately focused and has sufficient energy may be used to create an inventive welded joint in connection with the present invention.

In the illustrated ultrasonic transducer 1, the electron beam, which is always aligned parallel to the line of contact between a magnet plate and the ultrasonic horn (as is evident from FIGS. 1 and 2), is first directed from one side according to arrow E1 onto ultrasonic horn 2 or side wall 11 of pedestal-like elevation 10, during which the penetration depth, which can be adjusted by the energy of the electron beam being used, of the electron beam is to be chosen such that it penetrates into the material, with sufficient energy to produce a permanent welded joint, approximately as far as the middle of edge 5 of the respective magnet plate 4 bearing on contact face 6. In the process, the electron beam is guided according to arrow F1—in an alignment that is always parallel to arrow E1—linearly over the joint zone, so that all magnet plates 4 accommodated in the six receiving pockets 8 are welded linearly to ultrasonic horn 2 at least as far as the middle of contact face 6 or 7.

Thereafter a corresponding welding operation is repeated from the other side of magnet plates 4. For this purpose, the electron beam, with constant alignment, is guided according to arrow E2 over the joint zone (see arrow F2), with the effect that all magnet plates 4 are welded along their edges to ultrasonic horn 2 upon completion of the described process. If necessary, it would also be possible to guide the electron beam in the inverse direction compared with the course illustrated according to arrow F2, for example if the simultaneous use of two electron and/or laser beams directed onto the joint zone from different sides is being considered for creation of the welded joint.

The ultrasonic vibration imposed by means of driver 3 can then be transmitted effectively via the electron-beam-welded (or laser-beam-welded) joint zone to the ultrasonic horn, where it is amplified by constriction 13 of horn 2 and transmitted to ultrasonic head 14, which is then excited to vibration according to double arrow A.

Ultrasonic horn 2 is provided with a circumferential fastening flange 15, with which it can be fastened, for example, to an external structure. A node point of the vibration transmitted in longitudinal direction through ultrasonic horn 2 is suitable as an attachment point for flange 14.

Figure 4:
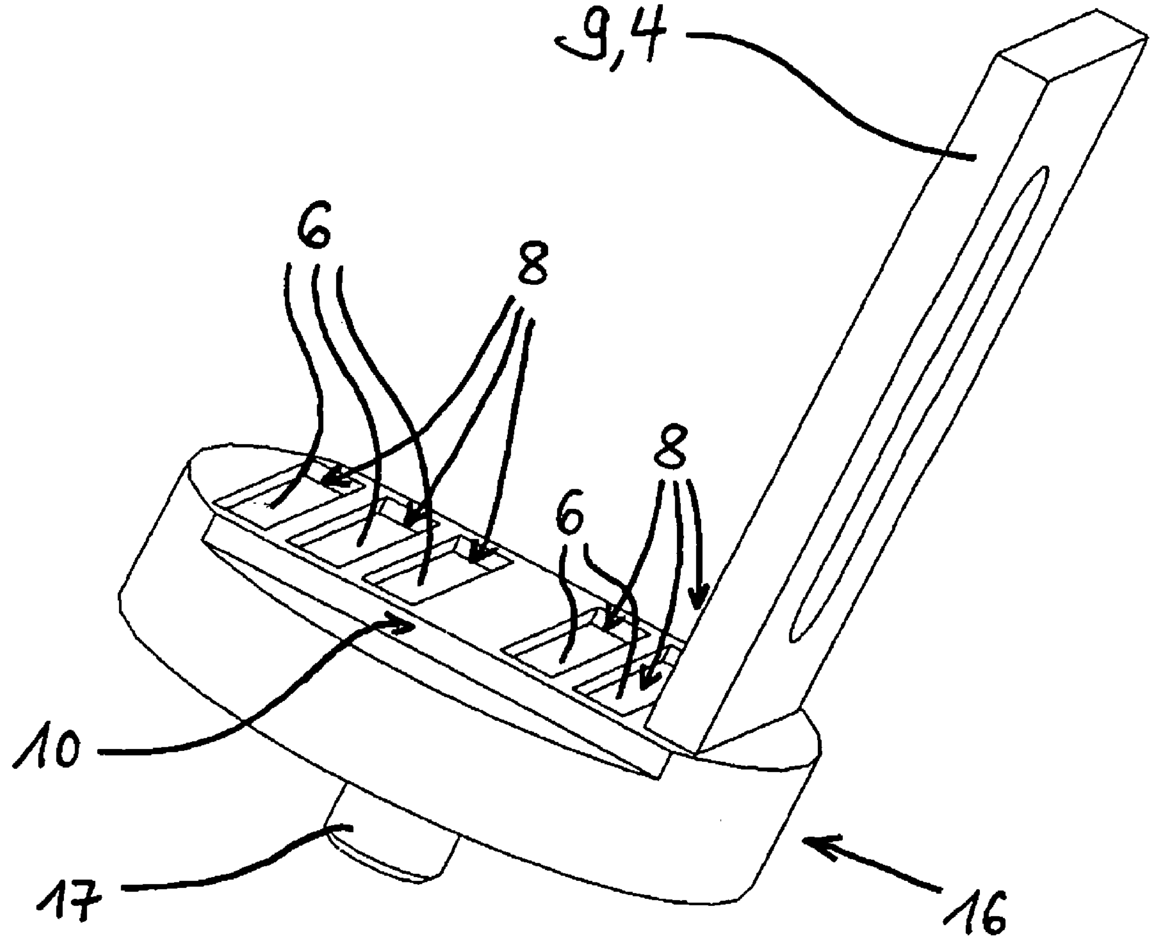
FIG. 4 shows an intermediate piece of a second exemplary embodiment of an inventive ultrasonic transducer.

Finally, FIG. 4 further illustrates that the zone of ultrasonic horn 2 provided with contact face(s) 6 may be constructed if necessary in the form of an intermediate piece 16, which is joined to the other part of the ultrasonic horn (not illustrated)—for example by a screwed connection. For this purpose, in the illustrated example, intermediate piece 16 is advantageously provided on its underside with a threaded pin 17 having a male thread, not illustrated, with which a screwed connection can be made with a corresponding female thread on the other part of the ultrasonic horn. In this case also magnet plates 4, grouped into a total of six stacks 9 (of which only one is illustrated once again and, for simplicity, only stack 9 as a whole is illustrated here) and forming driver 3, are welded by an electron beam or laser beam, at their edge proximal to intermediate piece 16 of the ultrasonic horn, in the zone of a contact face 7 of intermediate piece 16 formed by the bottom of receiving pockets 8, to this ultrasonic horn. As in the previous exemplary embodiment, receiving pockets 8 are formed in a pedestal-like elevation 10 of the end (formed in this case by intermediate piece 16) of the ultrasonic horn proximal to driver 3.

Figure 5:
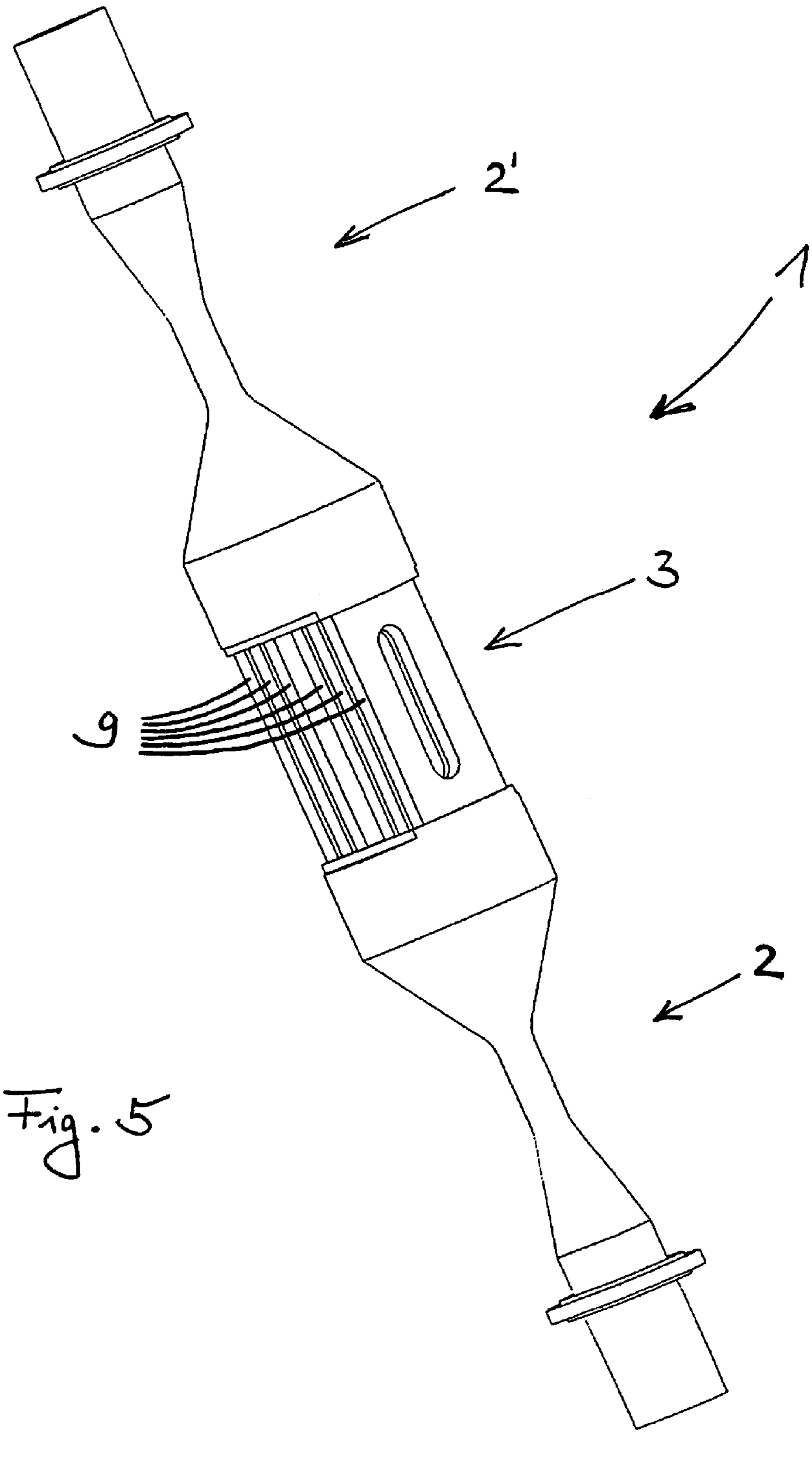
FIG. 5 shows a perspective view of a third exemplary embodiment of the present invention.

FIG. 5 shows a third exemplary embodiment of an inventive ultrasonic transducer, which is composed of one driver 3 and two ultrasonic horns 2, 2', wherein the two ultrasonic horns 2, 2' are disposed in opposite orientations on opposite sides of the driver—which is composed of six stacks 9 of magnet plates, just as was the case hereinabove—and are respectively welded thereto in the way already described in the foregoing. Here also it would be possible, for example, for the respective end zone of the two ultrasonic horns 2, 2' proximal to the driver to be formed by an intermediate piece, which is joined to the other part of the ultrasonic horn.

Figure 6:
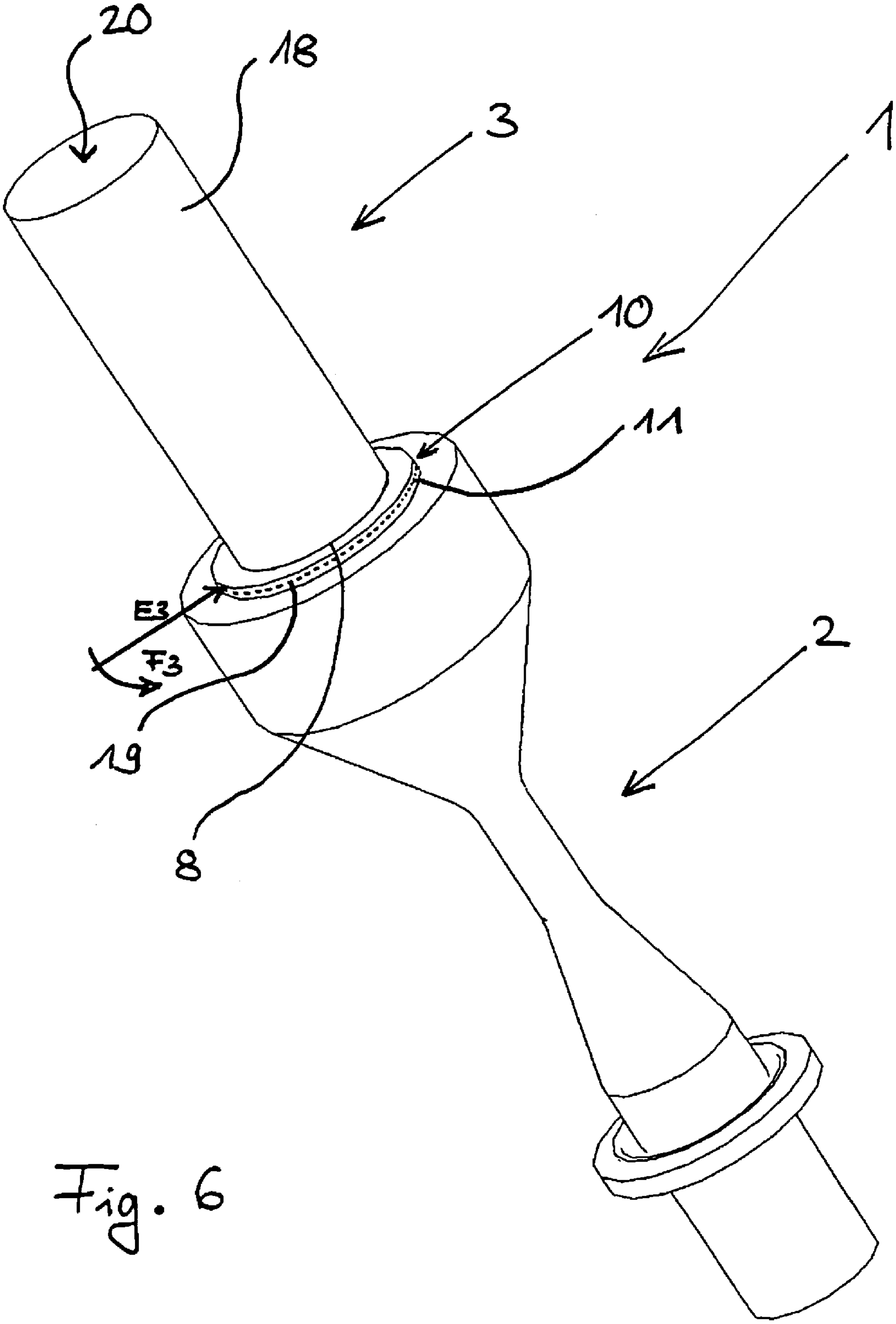
FIG. 6 shows a perspective view of a fourth exemplary embodiment of the present invention.

FIG. 6 shows a fourth exemplary embodiment of an inventive ultrasonic transducer comprising ultrasonic horn 2 and driver 3, wherein driver 3 is composed of exactly one magnetostrictive element 18 in the form of a bar, which again is accommodated at one end in a receiving pocket 8, adapted to the round cross section and disposed in a pedestal-like elevation 10 on ultrasonic horn 2, and therein is welded to ultrasonic horn 2 in the zone of the contact face formed by the bottom of receiving pocket 8. For this purpose a laser or electron beam can be directed according to arrow E3 onto side bounding wall 11 of the pedestal-like elevation and (for example by rotating the ultrasonic horn)—while ensuring that its alignment is kept parallel to the contact face at the height thereof and is always directed radially onto the midpoint of the round cross section—can be guided according to arrow F3 around pedestal-like elevation 10 (see dashed line 19), with the effect that here also a first part of the welded joint is created from a first side and a second part of the welded joint is created from a second side of the ultrasonic horn, with a penetration depth of the electron or laser beam extending preferably to only approximately the middle.

Figure 7:
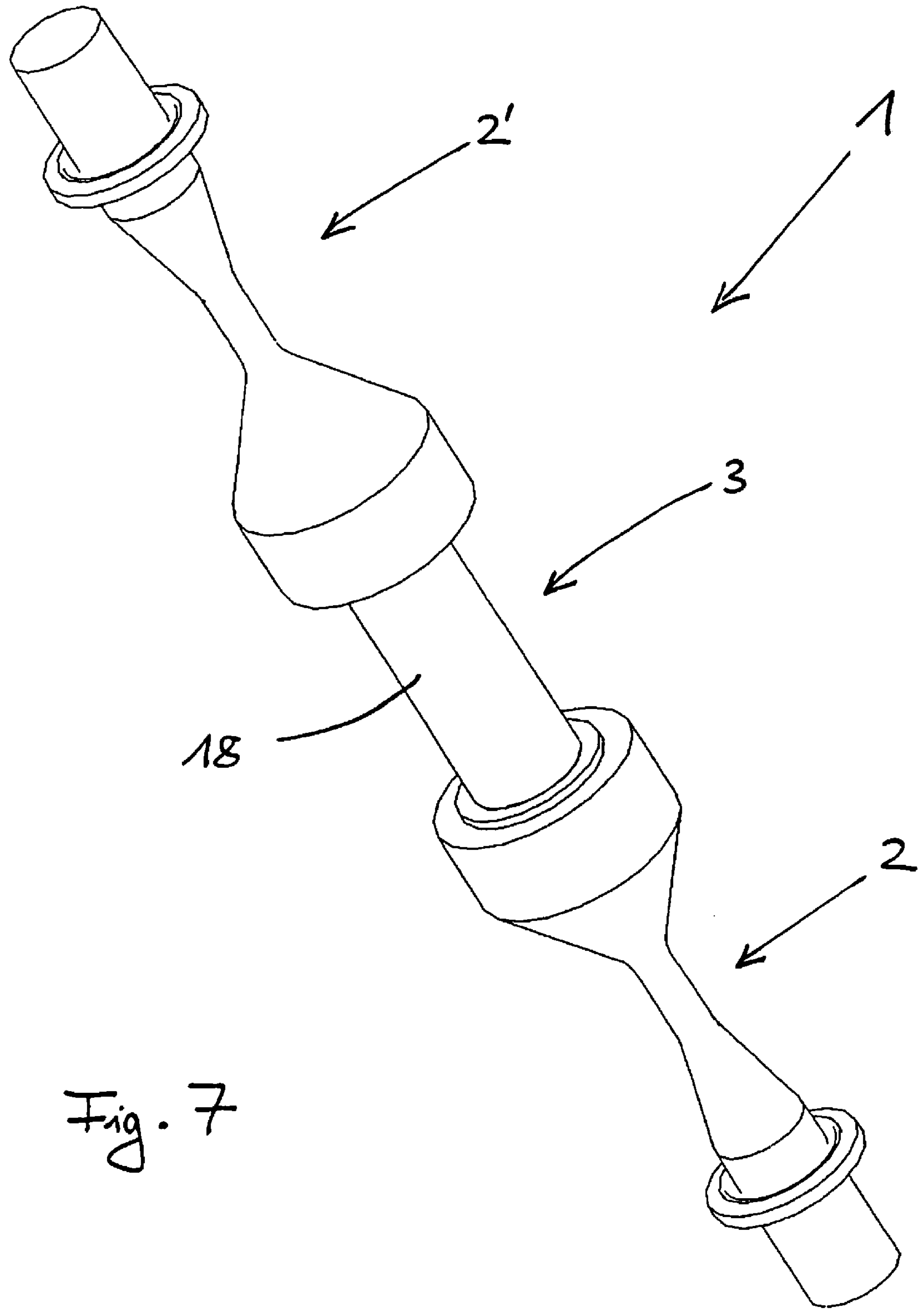
FIG. 7 shows a perspective view of a fifth exemplary embodiment of the present invention.

And, finally, FIG. 7 shows yet a fifth exemplary embodiment of the invention, again with two ultrasonic horns 2, 2' (with construction identical to that of FIG. 6) and a driver 3 disposed between them and composed of a single bar-shaped magnetostrictive element 18. The difference compared with the ultrasonic transducer illustrated in FIG. 6 is that, on side 20 of driver 3 distal to first ultrasonic horn 2 there is disposed a further ultrasonic horn 2'—of design identical to that of first ultrasonic horn 2—which is welded to this driver in the already described way. In the examples according to FIGS. 6 and 7 also, it is possible for the zone of the ultrasonic horn proximal to the driver to be constructed if necessary in the form of a separate intermediate piece.

We claim:

1. An ultrasonic transducer comprising:

an ultrasonic horn and a magnetostrictive driver, wherein the driver is joined to a contact face of the ultrasonic horn proximal thereto, wherein the driver and the ultrasonic horn are joined in a zone of the contact face by electron-beam welding and/or laser-beam welding, wherein the contact face is formed by the bottom of at least one receiving pocket, which accommodates the end of the driver proximal to the ultrasonic horn, wherein the at least one receiving pocket is formed in a pedestal-like elevation of an end of the ultrasonic horn proximal to the driver, and wherein the height of the pedestal-like elevation is greater than the depth of the at least one receiving pocket formed therein.

2. An ultrasonic transducer according to claim 1, wherein the driver comprises exactly one magnetostrictive element.

3. An ultrasonic transducer according to claim 1, wherein the driver comprises a plurality of magnet plates.

4. An ultrasonic transducer according to claim 1, wherein there are provided a plurality of receiving pockets, in each of which part of the driver or of the magnet plates is accommodated.

5. An ultrasonic transducer according to claim 1, wherein the ultrasonic horn and/or the magnetostrictive material of the driver is subjected at least in part to a heat treatment.

6. An ultrasonic transducer according to claim 1, wherein the ultrasonic horn is constructed in two pieces, wherein the contact face is formed on an intermediate part of the ultrasonic horn, which part is joined to the other part of the ultrasonic horn.

7. An ultrasonic transducer according to claim 1, wherein the ultrasonic horn comprises a first ultrasonic horn, the ultrasonic transducer further comprises a second ultrasonic horn, which is joined to the driver on a side thereof distal to the first ultrasonic horn, wherein the driver and the second ultrasonic horn are joined in the zone of a contact face of the second ultrasonic horn by means of electron-beam welding and/or laser-beam welding.

8. A method for creating a permanent joint between an ultrasonic horn and a magnetostrictive driver of an ultrasonic transducer, comprising:

joining the driver and the ultrasonic horn in the zone of a contact face of the ultrasonic horn proximal to the driver by electron-beam welding and/or laser-beam welding, and forming the contact face by the bottom of at least one receiving pocket, which accommodates the end of the driver proximal to the ultrasonic horn, wherein the at least one receiving pocket is formed in a pedestal-like elevation of the end of the ultrasonic horn proximal to the driver, wherein the height of the pedestal-like elevation is greater than the depth of the receiving pocket formed therein, and wherein the electron or laser beam is aligned or guided in such a way that it enters through the side bounding wall of the pedestal-like elevation into the monolithic ultrasonic horn at the height of the contact face and parallel thereto.

9. A method according to claim 8, wherein the driver is formed by a plurality of magnet plates, and wherein the electron or laser beam, during the welding operation, is always aligned parallel to the contact face as well as parallel to the lines of contact between the magnet plates and the contact face.

10. A method according to claim 8, wherein the electron and/or laser beam is guided over the joint zone in such a way that a first part of the welded joint is created from a first side and a second part of the welded joint is created from a second side.

* * * * *